(12) United States Patent
Nishinohara

(10) Patent No.: US 10,636,858 B2
(45) Date of Patent: Apr. 28, 2020

(54) DISPLAY DEVICE

(71) Applicant: Japan Display Inc., Tokyo (JP)

(72) Inventor: Takuma Nishinohara, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/981,235

(22) Filed: May 16, 2018

(65) Prior Publication Data

US 2018/0350892 A1  Dec. 6, 2018

(30) Foreign Application Priority Data

May 30, 2017  (JP) ................................ 2017-106531

(51) Int. Cl.
 *H01L 27/32* (2006.01)
 *H01L 51/00* (2006.01)

(52) U.S. Cl.
 CPC ...... *H01L 27/3276* (2013.01); *H01L 27/3265* (2013.01); *H01L 51/0097* (2013.01); *H01L 51/0096* (2013.01); *H01L 2251/5338* (2013.01)

(58) Field of Classification Search
 CPC ....... H01L 2027/11875; H01L 27/3276; H01L 27/3288; H01L 27/3297; H01L 27/1244; H01L 27/146; H01L 27/14601; H01L 23/52821; H01L 23/823475; H01L 23/823871; H01L 51/0097; H01L 2251/5338

See application file for complete search history.

(56) References Cited

U.S. PATENT DOCUMENTS

| | | | | |
|---|---|---|---|---|
| 8,471,995 B2* | 6/2013 | Tseng | ............... | G02F 1/133305 |
| | | | | 349/145 |
| 9,287,342 B2* | 3/2016 | Kwon | ................. | H01L 27/3276 |
| 9,318,427 B2* | 4/2016 | Youn | .................. | H01L 23/4985 |
| 9,490,312 B2* | 11/2016 | Lee | ..................... | H01L 27/3276 |
| 9,706,607 B2* | 7/2017 | Kim | ....................... | H05B 33/04 |
| 9,740,035 B2* | 8/2017 | Kwon | .............. | G02F 1/133305 |
| 9,980,326 B2* | 5/2018 | Kim | ....................... | H05B 33/04 |
| 10,068,960 B2* | 9/2018 | Ki | ........................ | H01L 27/1244 |
| 10,269,890 B2* | 4/2019 | Cho | .................... | H01L 51/0097 |
| 2014/0232956 A1* | 8/2014 | Kwon | .............. | G02F 1/133305 |
| | | | | 349/12 |
| 2014/0367658 A1 | 12/2014 | Kwak | | |
| 2016/0174304 A1 | 6/2016 | Kim et al. | | |
| 2018/0212051 A1* | 7/2018 | Wu | ..................... | H01L 51/0097 |
| 2019/0333980 A1* | 10/2019 | Wang | ................. | H01L 27/3276 |

FOREIGN PATENT DOCUMENTS

| | | |
|---|---|---|
| JP | 2012-238005 A | 12/2012 |
| JP | 2015-002177 A | 1/2015 |

* cited by examiner

*Primary Examiner* — David A Zarneke
(74) *Attorney, Agent, or Firm* — Michael Best & Friedrich LLP

(57) ABSTRACT

A display device includes a base layer having a first surface and a second surface, a display region arranged on the first surface of the base layer, a drive circuit region arranged on the outer side of the display region, and a wiring region between the display region and the drive circuit region. The wiring region includes a plurality of wirings having a plurality of connected polygonal shaped conductive patterns in which the inner portions thereof are removed, the base layer includes a plurality of through-holes penetrating from the first surface to the second surface in the wiring region, and the plurality of through-holes are arranged on the inner portion of the conductive pattern.

14 Claims, 14 Drawing Sheets

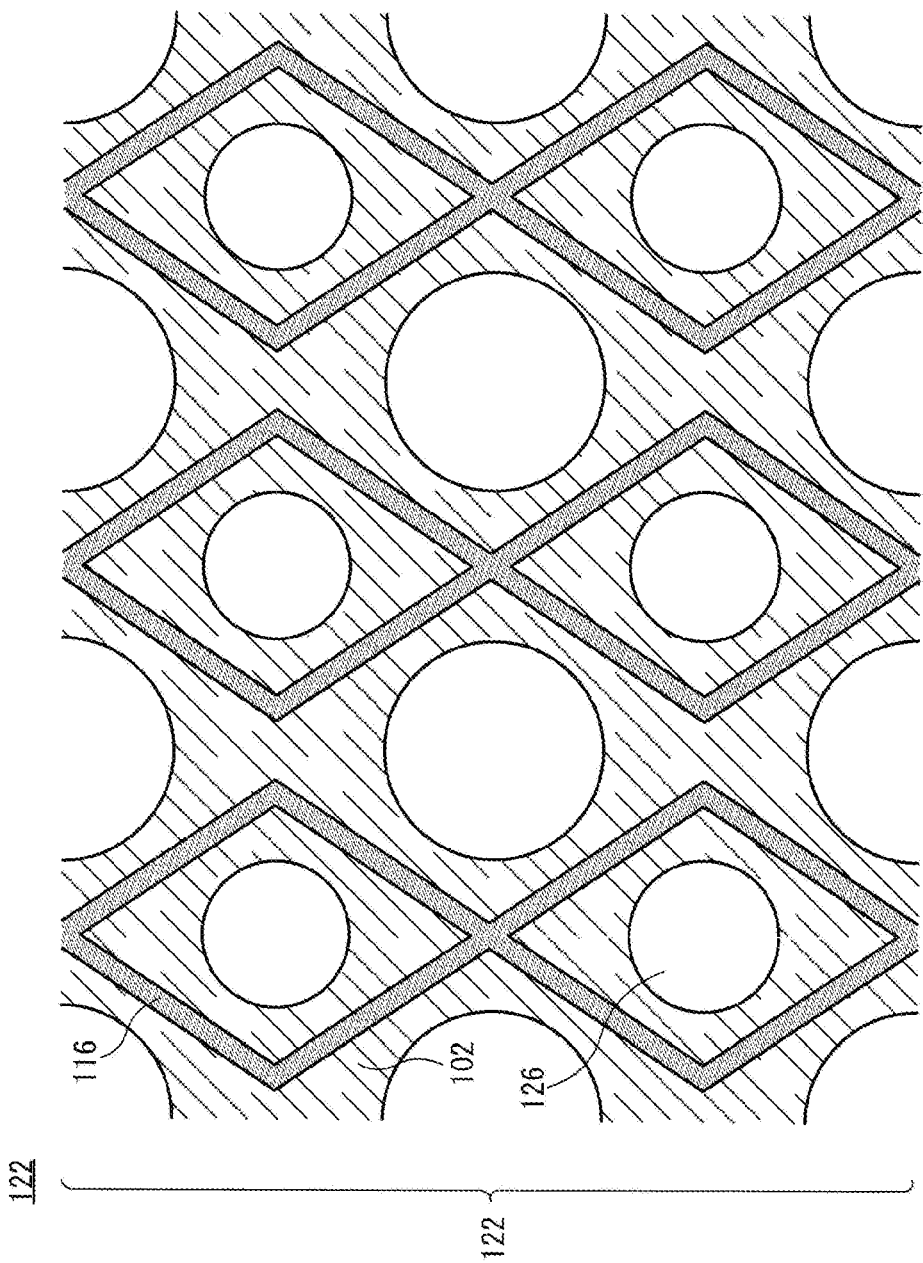

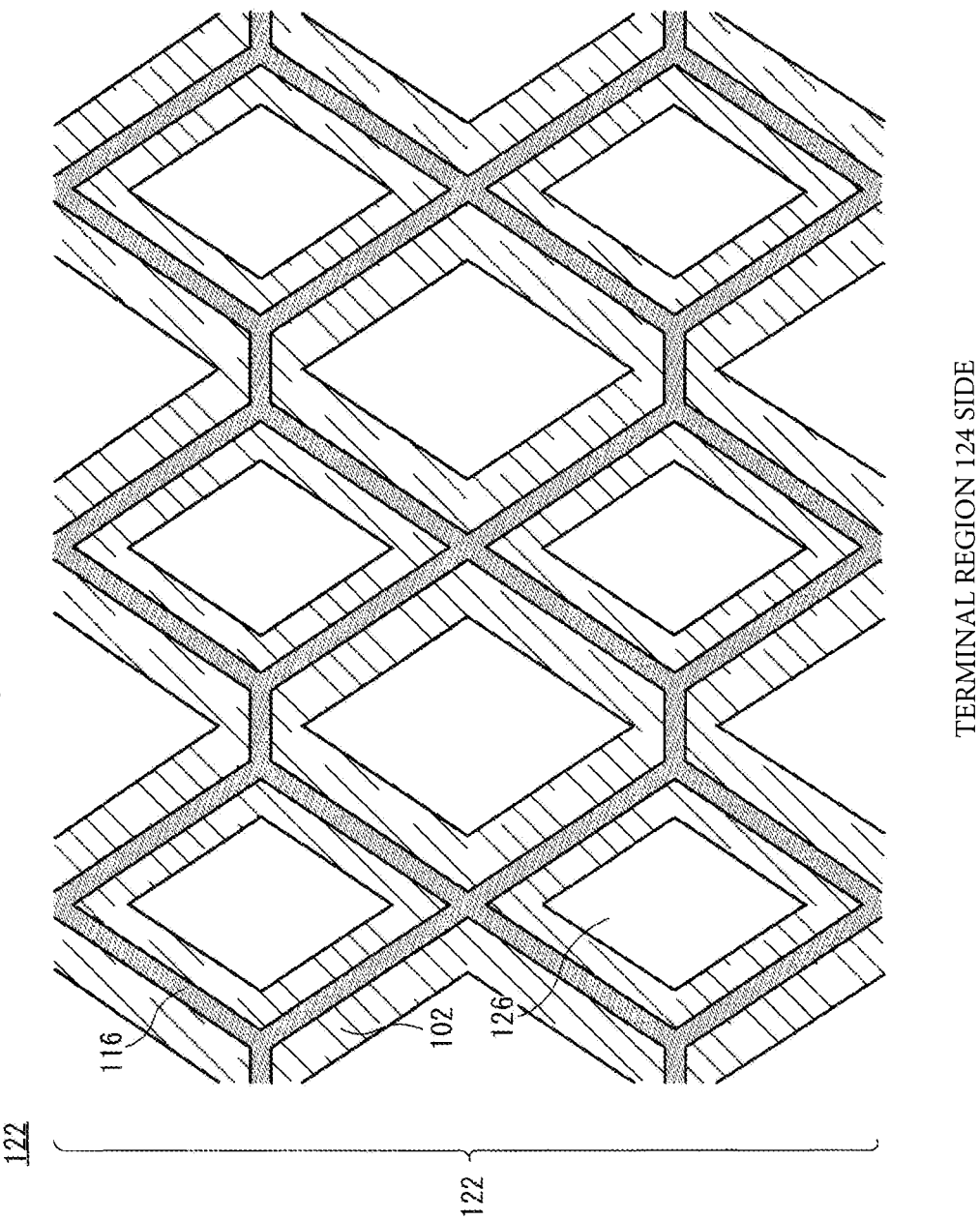

DISPLAY DEVICE

CROSS REFERENCE TO RELATED APPLICATIONS

This application is based upon and claims the benefit of priority from the prior Japanese Patent Application No. 2017-106531, filed on May 30, 2017, the entire contents of which are incorporated herein by reference.

FIELD

The embodiments of the present invention relate to the wiring of a flexible display device and the structure of a substrate.

BACKGROUND

A display device forming a screen for liquid crystal televisions, tablet terminals, portable information terminals called smart phones, and the like is manufactured using a glass substrate and secured in a casing. Normally, these types of display devices are not intended for use by bending and folding. However, flexible display devices that may be bent and folded are expected to develop new uses not found in conventional products. For example, in the specifications of Japanese Laid-Open Patent Publication Number 2012-238005, Japanese Laid-Open Patent Publication Number 2015-2177, and U.S. Patent Application Publication Number 2016/0174304, a flexible display device manufactured using a thin plastic film is disclosed.

SUMMARY

A display device according to an embodiment of the present invention includes a base layer having a first surface and a second surface, a display region arranged on the first surface of the base layer, a drive circuit region arranged on the outer side of the display region, and a wiring region between the display region and the drive circuit region. The wiring region has a plurality of wirings having a plurality of connected polygonal shaped conductive patterns in which the inner portions thereof are removed, the base layer includes a plurality of through-holes penetrating from the first surface to the second surface in the wiring region, the plurality of through-holes are arranged in an inner portion of the conductive pattern.

BRIEF DESCRIPTION OF DRAWINGS

FIG. 6 is a plan view showing a structure of a wiring region of a display device according to an embodiment of the present invention;

FIG. 7 is a plan view showing a structure of a wiring region of a display device according to an embodiment of the present invention;

DESCRIPTION OF EMBODIMENTS

Hereinafter, each embodiment of the present invention will be described while referencing the drawings. However, without deviating from the gist, the present invention may be implemented in various ways, thus interpretation thereof should not be limited to the content of the embodiments exemplified below.

In order to provide a clearer description, some components of the drawings such as the width, thickness, and shape of each part are represented schematically. These schematic drawings are merely examples and do not limit interpretation of the present invention. In this specification and in each of the drawings, elements with functions similar to those in previously described drawings are marked with the same symbols, and detailed descriptions are omitted accordingly.

In the present invention, when one film is processed and a plurality of films are formed, these pluralities of films may have different functions and roles. However, these pluralities of films are derived from the same film formed in the same layer in the same step, have the same layer structure, and use the same materials. Accordingly, these pluralities of films are defined as being in the same layer.

In the scope of the present specification and the claims, when one structural element is simply expressed as being "above" another structural element, unless otherwise specified, includes situations in which a structural element is arranged directly above so as to be in contact with another structural element, and situations in which a structural element is above another structural element via further another structural element.

In the present specification and claims, the expression "a structural element is exposed from another structural element," refers to a state in which a portion of a structural element is not covered by another structural element and includes situations in which the portion not covered by another structural element is covered by further another structural element.

Figure 1:
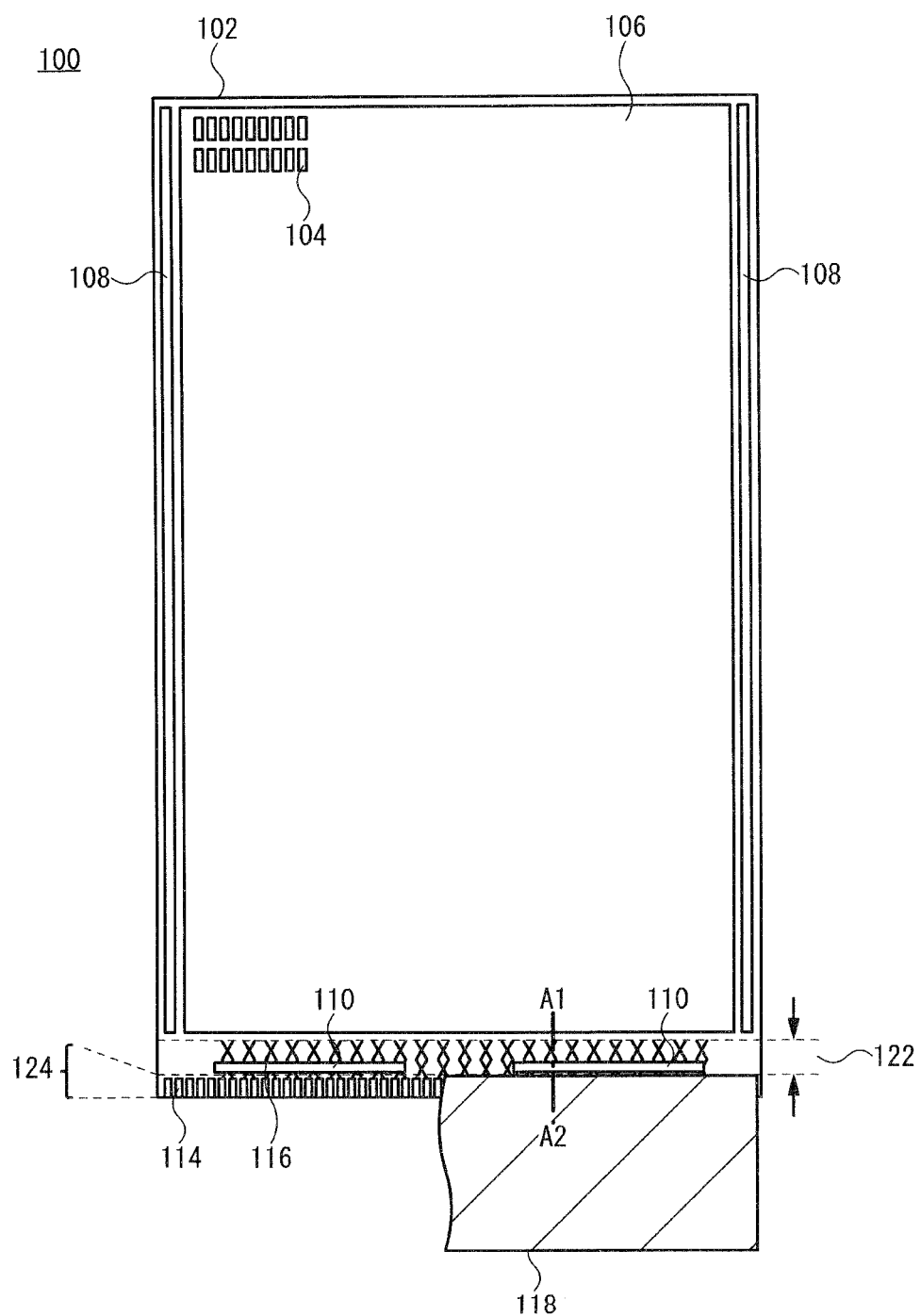
FIG. 1 is a plan view showing a structure of a display device according to an embodiment of the present invention.

FIG. 1 is a plan view schematically showing the structure of a display device 100 according to an embodiment of the present invention. The display device 100 includes a display region 106, a scanning line drive circuit 108, a video signal line drive circuit 110, and a terminal region 124 in a base layer 102. Additionally, FIG. 1 shows a state in which a wiring region 122 is arranged between the display region 106 and the video signal line drive circuit 110.

The base layer 102 is formed by an organic resin material. For example, organic resin materials such as polyimide, polyamide, polyester, and polycarbonate are used as the material forming the base layer 102. The base layer 102 applied in the present embodiment is formed with a thickness of 5 μm to 200 μm and is flexible. Further, the base layer 102 may be referred to as a substrate or a substrate film. A stacked structure of various patterned insulating film, conductive film, and semiconductor film (hereinafter written as "function layer") is arranged above the base layer 102. A pixel 104, the scanning line drive circuit 108, the video signal line drive circuit 110, and a terminal 114 are configured by this function layer.

A plurality of pixels 104 are arranged in the display region 106. Each of the plurality of pixels 104 are configured from a display element and one or a plurality of transistors, capacitative elements, or the like for controlling the display element. The arrangement of the pixels 104 is arbitrary, and may be a stripe arrangement, a delta arrangement, a mosaic arrangement, or the like. A scanning signal line and an image signal line (not illustrated) are provided in accordance with the arrangement of the plurality of pixels 104 in the display region 106. A plurality of wirings 116 extend from the display region 106 in the direction of the edge portion of the base layer 102. The wiring 116 is exposed at the edge portion and forms a plurality of terminals 114 arranged along one side (for example, a narrow side) of the base layer 102. A connector 118 such as a flexible printed circuit substrate (FPC) is provided so as to cover and be electrically connected to the terminal 114. Various signals supplied from an external circuit are supplied to the scanning line drive circuit 108, the video signal line drive circuit 110, and the pixel 104 via the connector 118, the terminal 114, and the wiring 116. The pixel 104 is controlled and an image is displayed above the display region 106 based on these signals.

The scanning line drive circuit 108 is a circuit outputting scanning signals to scanning signal lines. The video signal line drive circuit 110 is a circuit outputting image signals to image signal lines. In the present embodiment, the region in which the scanning line drive circuit 108 and the video signal line drive circuit 110 are provided is referred to as the drive circuit region. The drive circuit region has a function for supplying signals for driving a transistor provided in the pixel 104, and is arranged in the periphery of the display region 106. In FIG. 1, two scanning line drive circuits 108 are provided so as to sandwich the display region 106, however, it is not limited to this, and a scanning line drive circuit 108 may be provided on only one side of the display region 106. The video signal line drive circuit 110 may be provided above the base layer 102, similar to the scanning line drive circuit 108, or a semiconductor chip called a driver IC may be mounted above the base layer 102. In the description below, the structure of the display device 100 will be described based on an example in which a driver IC is mounted as the video signal line drive circuit 110.

A terminal region 124 is arranged on the edge portion of the base layer 102. The terminal region 124 includes a plurality of terminals 114.

A wiring region 122 is provided in a region sandwiched by the terminal region 124 and the display region 106. The base layer 102 of the wiring region 122 includes a plurality of through-holes 126 penetrating from the first surface to the second surface. In the present embodiment, the wiring region 122 becomes the region in which the base layer 102 is bent. When the base layer 102 is bent, the wiring included in the wiring region 122 is also bent.

Figure 2:
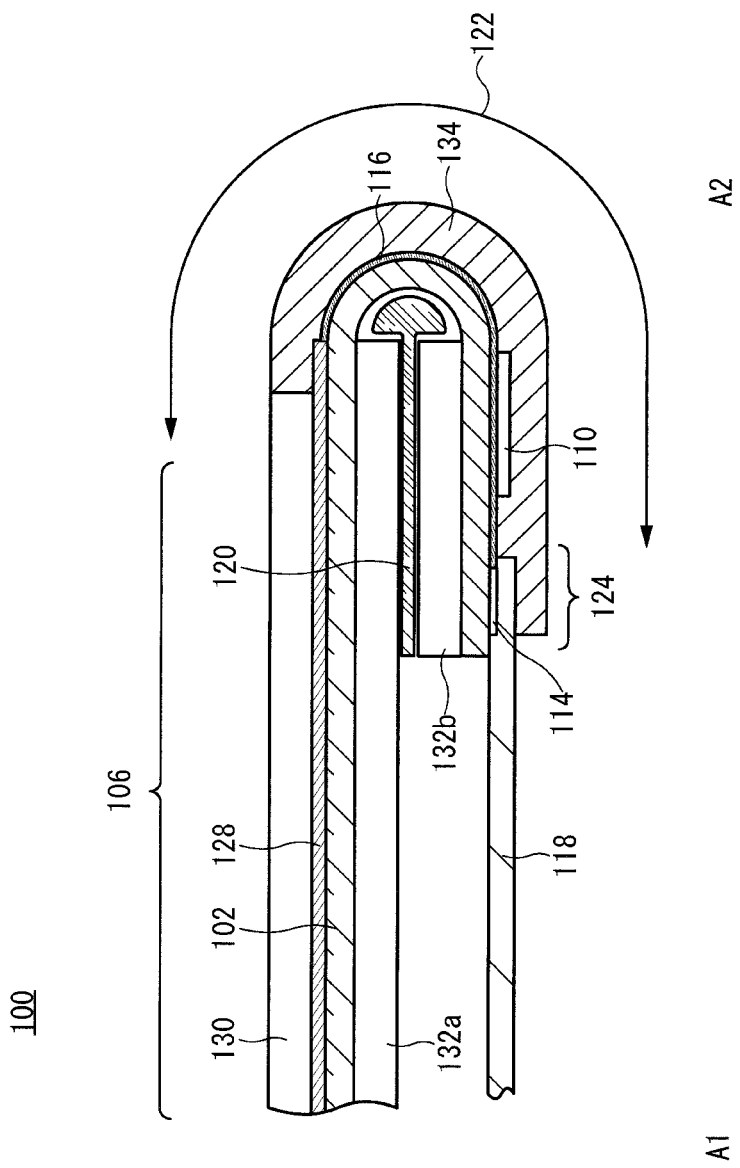
FIG. 2 is a cross-sectional view showing a structure of a display device according to an embodiment of the present invention.

A cross-sectional structure taken along line A1-A2 shown in FIG. 1 will be described while referencing FIG. 2. FIG. 2 shows a state in which the base layer 102 is bent.

The base layer 102 is bent at the region between the display region 106 and the video signal line drive circuit 110 so as to arrange the video signal line drive circuit 110 and the terminal region 124 on the back side of the display region 106. At that time, a portion of the wiring region 122 may overlap the display region 106 below the display region 106.

A function layer 128 is formed on the first surface of the base layer 102 (the surface above the base layer 102 in FIG. 2). A surface protection film 130 may be provided as an arbitrary structure above the function layer 128. Similarly, a rear protection film 132 may be provided as an arbitrary structure on the second surface of the base layer 102 (the surface below the base layer 102 in FIG. 2). The rear protection film 132 may be divided in the region overlapping the wiring region 122 of the base layer 102, or a through-hole 126 may be formed. The rear protection film 132 is divided into two portions (a first rear protection film 132*a*, a second rear protection film 132*b*) in the cross-sectional structure shown in FIG. 2. The first rear protection film 132*a* is provided so as to sandwich the display region 106 with the first rear protection film 132*a* and the surface protection film 130. On the other hand, the second rear protection film 132*b* is provided so as to sandwich the base layer 102 with the second rear protection film 132*b* and the terminal 114. The region in which the rear protection film 132 is provided is thicker than the region overlapping the wiring region 122 in which the rear protection film 132 is not provided. For this reason, the region in which the rear protection film 132 is not provided is relatively easily bent compared to the region in which the rear protection film 132 is provided.

The wiring 116 extends from the display region 106 through the wiring region 122 to the terminal region 124. Since the through-hole 126 is formed in the base layer 102 of the wiring region 122, the display device 100 may easily or selectively bend in the wiring region 122. For example, when the display device 100 has a three-dimensional structure as shown in FIG. 2, the wiring 116 and the base layer 102 are bent in the wiring region 122, and the shapes of two wiring regions 122 are changed so as to overlap each other. A protection film 134 may be provided on the first surface of the base layer 102 in the wiring region 122 so as to protect the wiring 116 and the video signal line drive circuit 110, and a portion of the protection film 134 may overlap the connector 118.

A spacer 120 may be provided as an arbitrary structure between the first rear protection film 132*a* and the second rear protection film 132*b*. The spacer 120 may have a semi-circular curved surface portion in contact with the base layer 102 at the tip portion, and a flat surface portion connected to this curved surface portion. The spacer 120 operates so the radius of bending (curvature radius) becomes constant by being arranged so as to come in contact with the rear surface of the base layer 102 in the region in which the base layer 102 is bent. Additionally, by sandwiching the flat portion with the first rear protection film 132*a* and the second rear protection film 132*b*, the display device 100 is stably held in place. By using the spacer 120, the shape of the display device may be stabilized.

Figure 3:
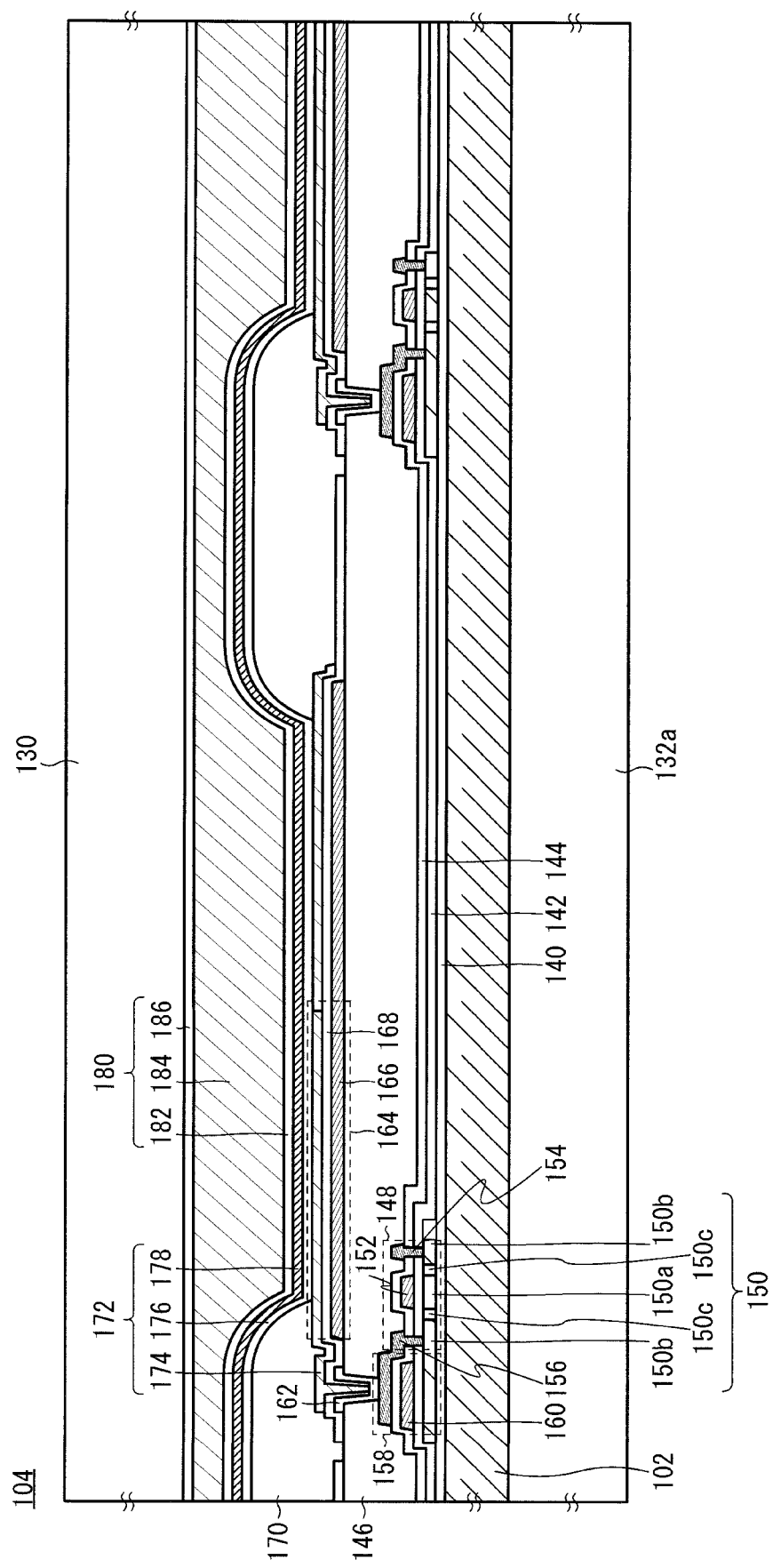
FIG. 3 is a cross-sectional view showing a structure of a display region of a display device according to an embodiment of the present invention.

FIG. 3 is a schematic cross-sectional view of a pixel 104 showing a transistor 148, a capacitative element 158, an additional capacitative element 164, and a light emitting element 172 provided in the pixel 104. The number of transistors and capacitative elements provided in one pixel 104 is not limited.

An undercoat layer 140 is provided above the base layer 102. The undercoat layer 140 is a film preventing the spread of impurities from the base layer 102 to semiconductor elements such as the transistor 148 and the capacitative element 158. The transistor 148 and the capacitative element 158 are provided above the undercoat layer 140. The transistor 148 shown here is a top gate type transistor, and may have a semiconductor film 150, a gate insulating film 142, a gate electrode 152, an interlayer film 144, source/drain electrodes 154, 156, and the like. The wiring 116 is formed in the same layer as the conductive layer forming the gate electrode 152, or the same layer as the conductive layer forming the source/drain electrodes 154, 156. The semiconductor film 150 is configured by a channel region 150a overlapping the gate electrode 152, an impurity region 150b, and a low-density impurity region 150c. The capacitative element 158 is configured by a capacitative electrode 160 and a portion of the semiconductor film 150 overlapping this (impurity region 150b), a gate insulating film 142, an interlayer film 144, and a portion of the source/drain electrode 156. The structure of the transistor 148 is not limited and may be a bottom gate type transistor. Additionally, the vertical relationship of the semiconductor film 150 and the source/drain electrodes 154, 156 is not limited.

A planarization film 146 is provided above the transistor 148 and the capacitative element 158 for absorbing unevenness formed by the transistor 148 and the capacitative element 158 and for providing a planar upper surface. An opening exposing the source/drain electrode 156 is provided in the planarization film 146. A connection electrode 162 may be formed in the opening as an arbitrary structure. An additional capacitative electrode 166 and an additional capacitative insulating film 168 covering the connection electrode 162 and the additional capacitative electrode 166 are further provided above the planarization film 146. A first electrode 174 electrically connected to the source/drain electrode 156 via the connection electrode 162 is provided in the previously described opening above the additional capacitative film 168. The additional capacitative element 164 is configured by the additional capacitative electrode 166, the additional capacitative insulating film 168, and the first electrode 174.

A partition 170 is provided so as to cover the opening provided above the planarization film 146 and the edge portion of the first electrode 174, and an EL layer 176 and a second electrode 178 covering the EL layer 176 are provided above the first electrode 174 and the partition 170. A light emitting element 172 is configured by the first electrode 174, the EL layer 176, and the second electrode 178. The structure of the EL layer 176 is not limited and may have a single layer or a plurality of layers having a variety of functions.

The display device 100 may further have a passivation film 180 covering the display region 106 as an optional structure. In the example shown here, the passivation film 180 has a first layer 182, a second layer 184, and a third layer 186. The first layer 182 and the third layer 186 work as a blocking film preventing impurities permeating mainly from the exterior, and the second layer 184 has a function mainly for providing a planar surface.

The surface protection film 130 is provided above the passivation film 180, and the first rear protection film 132a is provided under the base layer 102 in the display region 106. In the present specification and claims, the stacked layer structure configured of the previously described various insulating films, conductive films, and semiconductor films provided between the base layer 102 and the surface protection film 130 is referred to as the function layer 128.

Figure 4:
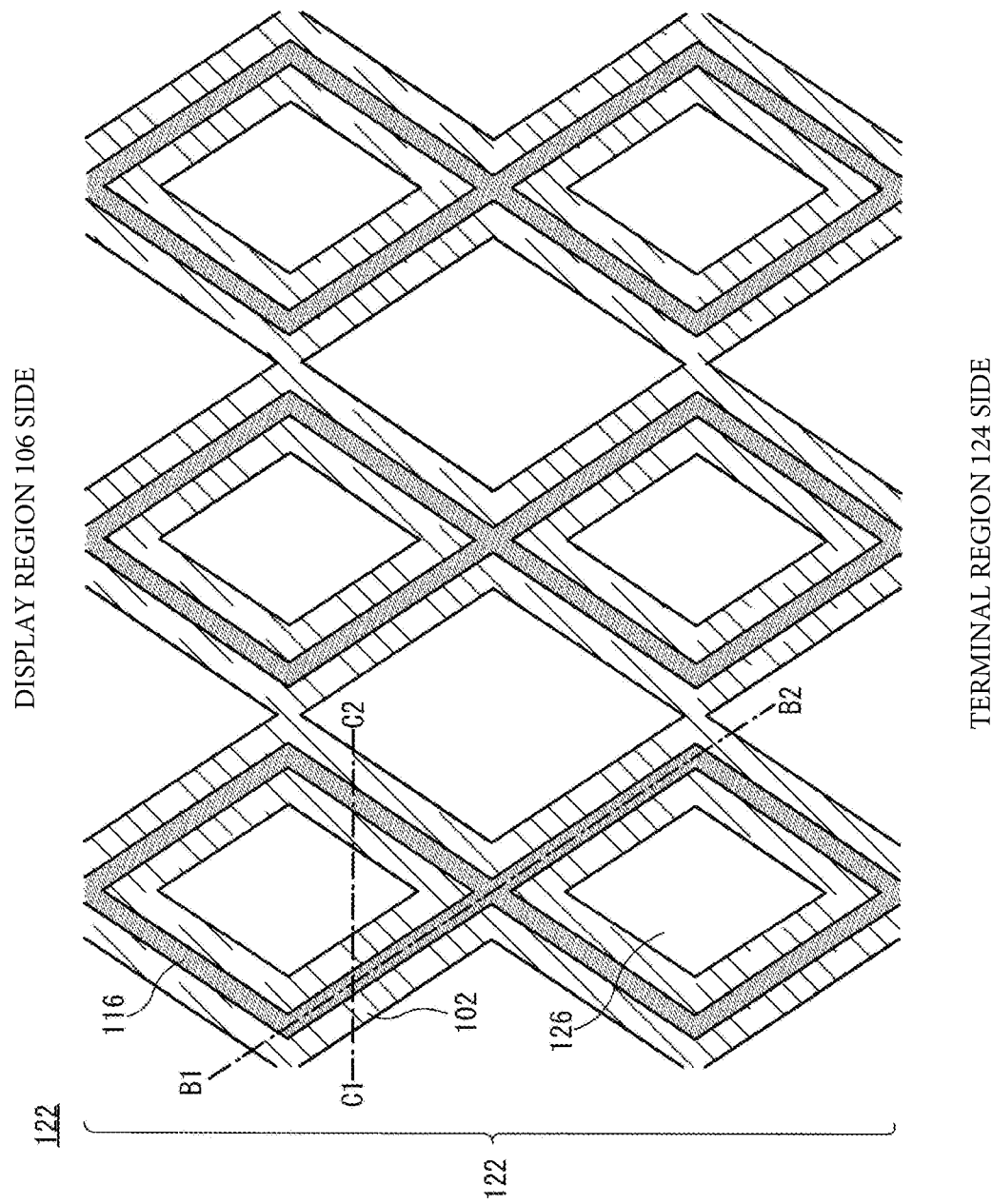
FIG. 4 is a plan view showing a structure of a wiring region of a display device according to an embodiment of the present invention.
Figure 5A:
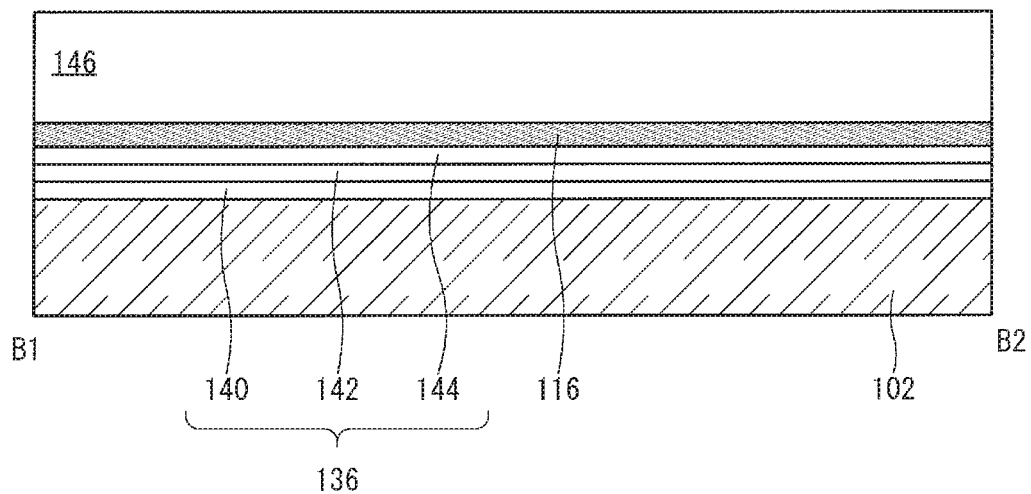
FIG. 5A is a cross-sectional view of a wiring region taken along dotted line B1-B2 of FIG. 4.
Figure 5B:
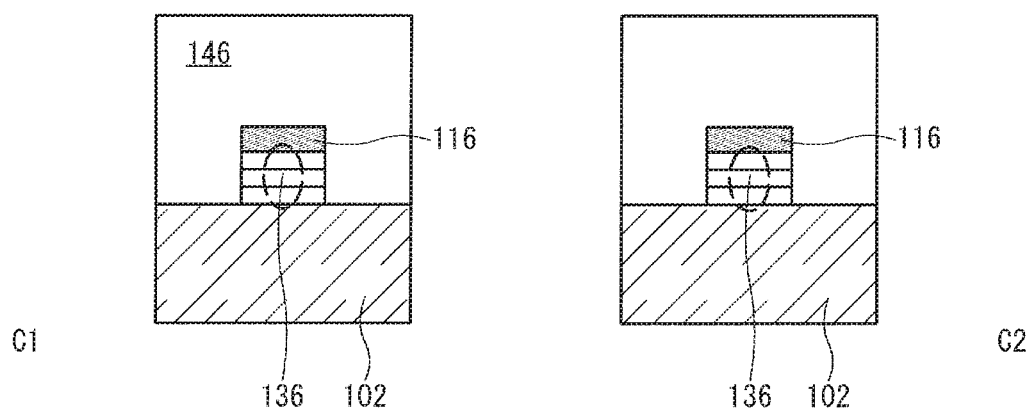
FIG. 5B is a cross-sectional view of a wiring region taken along dotted line C1-C2 of FIG. 4.

FIG. 4 is an enlarged top view of the wiring region 122 according to an embodiment of the present invention, and FIG. 5A and FIG. 5B are cross-sectional schematic views of the wiring region 122 taken along the dotted line B1-B2 and the dotted line C1-C2 of FIG. 4 respectively. In FIG. 4, the upper surface structure of the long side of the base layer 102 (the side perpendicular to the direction in which the plurality of terminals 114 are arranged) and the central area of the base layer 102 are illustrated, and structural elements formed further above the wiring 116 are omitted.

As is shown in FIG. 4, the wiring 116 is arranged above the base layer 102. A through-hole 126 is provided in the base layer 102 of the wiring region 122. In a flexible display device, distortion occurs in the region in which the substrate bends, thin films are separated, cracks are generated, and wirings may disconnect. In order to increase flexibility in the wiring region 122, a plurality of through-holes 126 are preferably provided in the base layer 102. The wiring 116 shown in FIG. 4 has a form in which polygonal conductive patterns are connected. The wiring 116 is provided with an opening in the inner region of the polygonal conductive pattern so as not to cover the through-hole 126 of the base layer 102. In other words, two crooked conductive patterns of the wiring 116 may be arranged extending so as to avoid the through-hole 126 of the base layer 102 and to be electrically connected to each other. The conductive patterns of the wiring 116 not only extend linearly, but may have a geometrical shape as shown in FIG. 4, thus, the curvature radius of the wiring 116 when the base layer 102 is curved may be greater. Therefore, the shape of the wiring region 122 may change without placing a large burden on the wiring 116. Further, the number of paths through which signals may pass is greater in a geometrical pattern such as that shown in FIG. 4 than a conductive pattern which only extends linearly, thus, disconnection of the wiring 116 may be buffered. For this reason, wiring damage and disconnection may be effectively inhibited, and damage to the display device 100 may be prevented. In this way, in the wiring region 122, the geometrical shape of the wiring which may have a larger curvature radius is not limited to the shape shown in FIG. 4. For example, the conductive pattern may have a zigzag shape, a curved shape, a circular shape, a substantially circular shape, or a polygonal shape, or combine a plurality of shapes. Additionally, the vertexes and sides of both the first conductive pattern and the second conductive pattern may be directly connected, linearly connected, or connected with a curved line. Further, the wiring 116 is not limited in the number of wirings in or the shape of the wiring 122, so long as it is arranged above the base layer 102. For example, the number of wirings in the wiring 116 may be one wiring or a plurality of wirings. In other words, the wiring 116 only needs to cover a portion of the base layer 102 in which the through-hole 126 is provided in the wiring region 122.

As is shown in FIG. 5A and FIG. 5B, the insulating film 136 configured by a portion of the function layer 128 is provided in the wiring region 122 so as to be in contact with the base layer 102. The insulating film 136 may include inorganic compounds. Accordingly, hereinafter, the insulating film 136 will be referred to as the first inorganic insulating film. The first inorganic insulating film 136 may have a structure in which a plurality of insulating films are stacked, or be configured by a single insulating film.

The insulating films provided in the pixel 104, for example, the undercoat layer 140, the gate insulating film 142, and the interlayer film 144 may also be provided in the wiring region 122. However, it is not necessary for all of these three films to be provided in the wiring region 122 so long as at least one of them is formed. In the example shown here, the first inorganic insulating film 136 includes the undercoat layer 140, the gate insulating film 142, and the interlayer film 144.

The wiring 116 is formed so as to be in contact with the upper surface of the first inorganic insulating film 136 in the wiring region 122.

The protection film 134 is provided above the wiring 116, and one or more insulating films may be provided between the wiring 116 and the protection film 134. For example, as is shown in FIG. 5A and FIG. 5B, the planarization film 146, the insulating film 138, or the like may be provided between the wiring 116 and the protection film 134. The insulating film 138 may also include inorganic compounds and be configured by a portion of the function layer 128. Hereinafter, the insulating film 138 will be referred to as the second inorganic insulating film. The second inorganic insulating film 138 may be configured of a single film or a plurality of films. It is not entirely necessary for the entire planarization film 146 and the second inorganic insulating film 138 to be provided in the wiring region 122.

The planarization film 146, the additional capacitative insulating film 168, the first layer 182 and the third layer 186 of the passivation film, and the like provided in the pixel 104 may also be provided in the wiring region 122. It is not entirely necessary for all of these films and layers to be provided in the wiring region 122. For example, the planarization film 146 may be directly in contact with the protection film 134. In the example shown here, the second inorganic insulating film 138 includes the additional capacitative insulating film 168 and the first layer 182 and the third layer 186 of the passivation film.

The wiring 116 may have a shape such as a rhombus on the surface parallel to the first surface of the base layer 102, for example, as is shown in FIG. 4. Thus, even if the display device 100 is bent at an axis parallel to the short side of the base layer 102 as is shown in FIG. 2, the curvature radius of the wiring 116 is greater than when the wiring 116 is linear and perpendicular to the short side of the base layer 102. For this reason, without placing a great burden on the wiring 116, disconnection and damage to the wiring 116 may be prevented, and the bending resistance of the display device 100 may be improved.

Additionally, the bending resistance of the display device 100 may be improved by a buffer effect in which the through-hole 126 increases the degree of freedom for changing the shape of the base layer 102, thus making it easier to change the shape of the base layer 102.

Further, by adjusting the shape and number of through-holes 126 provided on the inner side of the conductive pattern of the wiring 116 arranged above the base layer 102, not only bending resistance but also adequate flexibility may be given to the wiring region. Thus, while maintaining bending resistance, the wiring region 122 may be consistent with various 3D shapes such as a sphere, and the possibilities of shapes that the display device can take on expand. In this way, the generation of display defects may be effectively inhibited and a highly reliable display device may be provided by applying this embodiment.

Hereinafter, the shape of the through-hole 126 of the base layer 120 and at least one pattern of the conductive patterns of the wiring 116 of which the shape has changed will be shown using the drawings.

FIG. 4 is an enlarged top view of the wiring region 122 when the shape of the through-hole 126 of the base layer 102 is a rhombus, and the conductive pattern of the wiring 116 is also a rhombus. When a through-hole 126 having the same shape as the conductive pattern of the wiring 116 is provided, a larger through-hole 126 than when the shape of the through-hole 126 is different may be provided on the inner side of the conductive pattern of the wiring 116. Thus, the flexibility of the wiring region 122 may be increased.

The shape of the through-hole 126 of the base layer 102 is not limited to a rhombus shape, and may be a circular shape, a substantially circular shape, or a polygonal shape. For example, as is shown in FIG. 6, the shape of the through-hole 126 of the base layer 102 may be a circular shape. When the shape of the through-hole 126 is a circular shape, flexibility in the base layer 102 may be more symmetrical than when the shape of the through-hole 126 is a polygonal shape such as a rhombus shape. Thus, a highly symmetrical flexible substrate may be realized.

In the conductive patterns of the wiring 116, the vertex of the first conductive pattern and the vertex of the adjacent second conductive pattern may be connected. For example, as is shown in FIG. 7, the vertex of the first rhombus shaped conductive pattern and the vertex of the adjacent second rhombus shaped conductive pattern may be linearly connected. FIG. 7 shows a case in which, similar to FIG. 4, a through-hole 126 is provided with the same shape as the conductive pattern of the wiring 116. Thus, a larger through-hole 126 may be provided on the inner side of the conductive pattern of the wiring 116, and the flexibility of the wiring region 122 may be increased. Additionally, since the first wiring 116 and the second wiring 116 are bridged at a third wiring 116, the number of paths through which signals pass is greater than that of FIG. 4, thus disconnection of the wiring 116 may be buffered.

Figure 8:
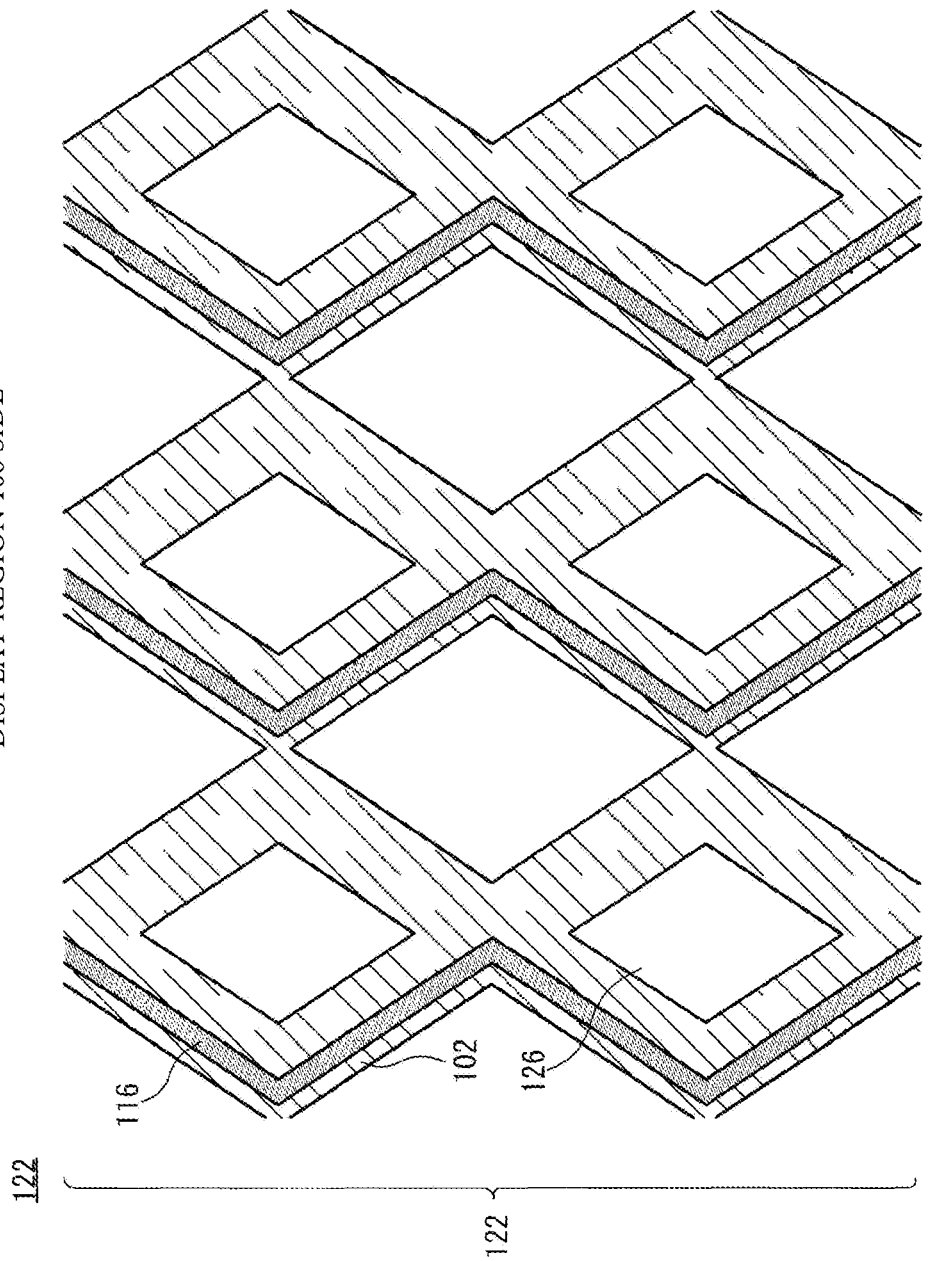
FIG. 8 is a plan view showing a structure of a wiring region of a display device according to an embodiment of the present invention.
Figure 9:
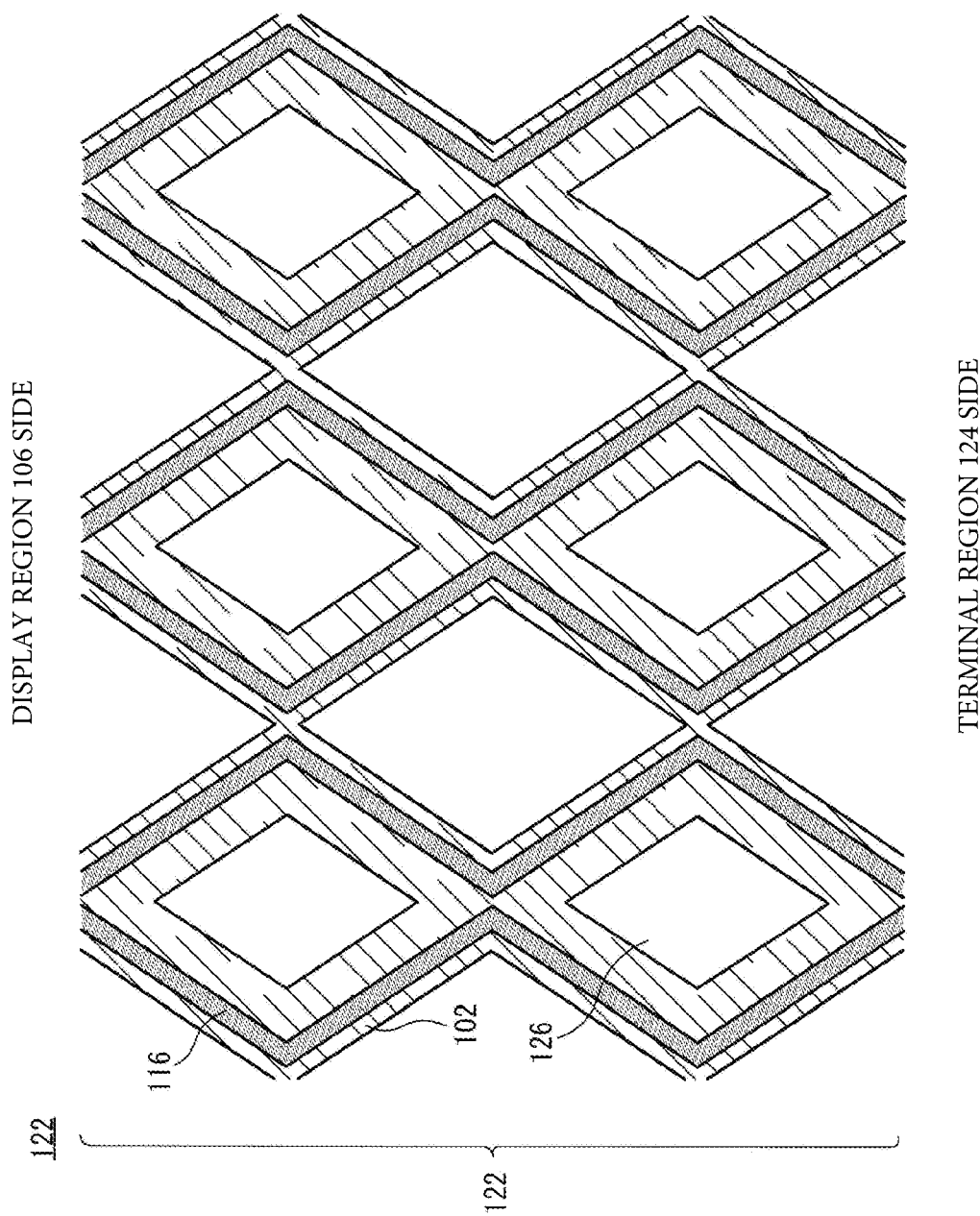
FIG. 9 is a plan view showing a structure of a wiring region of a display device according to an embodiment of the present invention.

The conductive pattern of the wiring 116 is not limited to a rhombus shape, and may be a zigzag shape, a curved shape, a circular shape, a substantially circular shape, or a polygonal shape. For example, as is shown in FIG. 8, the conductive pattern of the wiring 116 may be a zigzag shape. Further, as shown in FIG. 9, the vertexes of both the first zigzag shaped conductive pattern and the second zigzag shaped conductive pattern may be adjacent to each other. As in FIG. 8 and FIG. 9, since neither wiring has an intersection point, the wiring region 122 may be more flexible. Further, the layout of the conductive pattern of the wiring 116 may have a greater degree of freedom.

Figure 10:
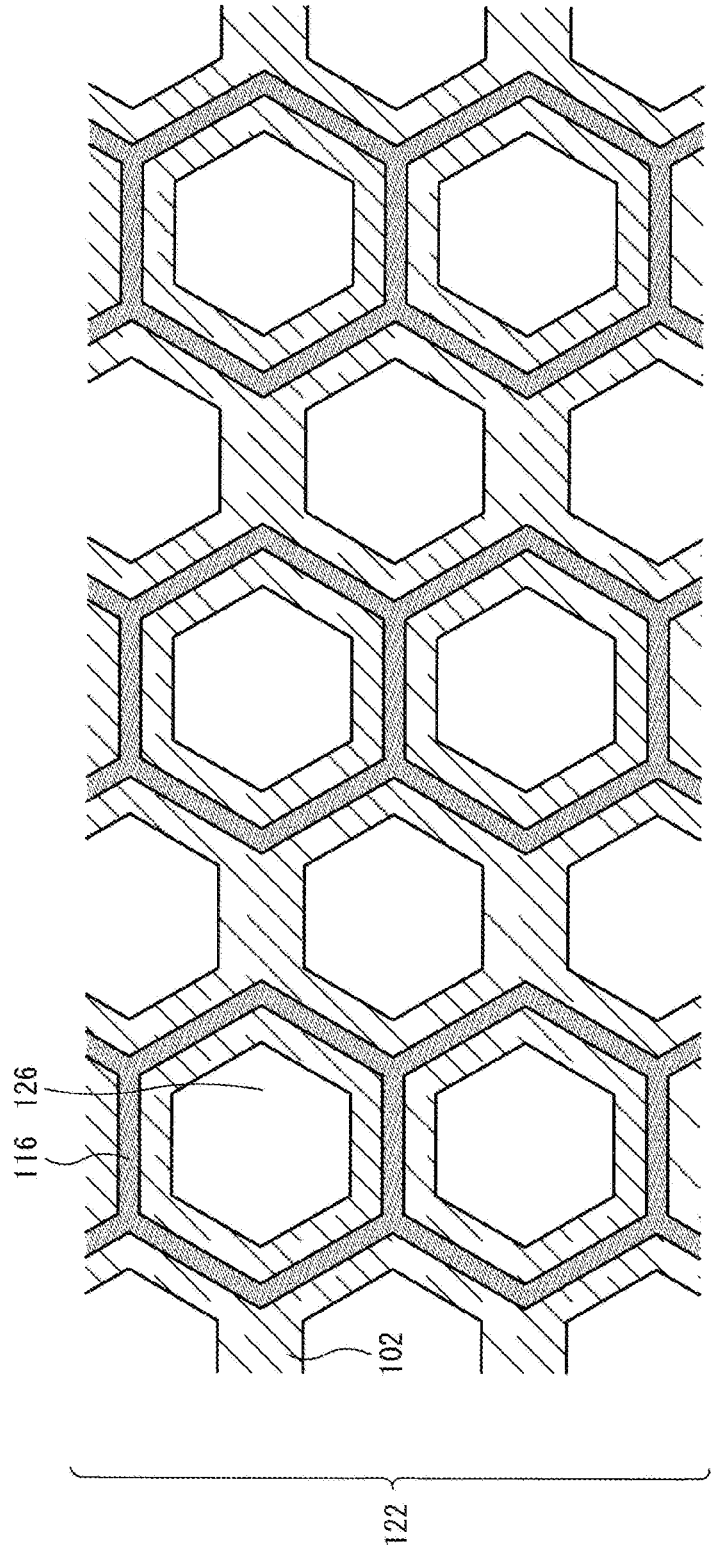
FIG. 10 is a plan view showing a structure of a wiring region of a display device according to an embodiment of the present invention.

FIG. 10 is an enlarged top view of the wiring region 122 when the shape of the through-hole 126 of the base layer 102 is a hexagonal shape, and the conductive pattern of the wiring 116 is also a hexagonal shape. By making the conductive pattern of the wiring a larger polygonal shape than the conductive pattern of the wiring of FIG. 4, such as the hexagonal conductive pattern of FIG. 10, the number of intersection points of the wirings 116 may increase. For this reason, the number of paths through which signals pass increases, and disconnection of the wiring 116 may be buffered.

Figure 11:
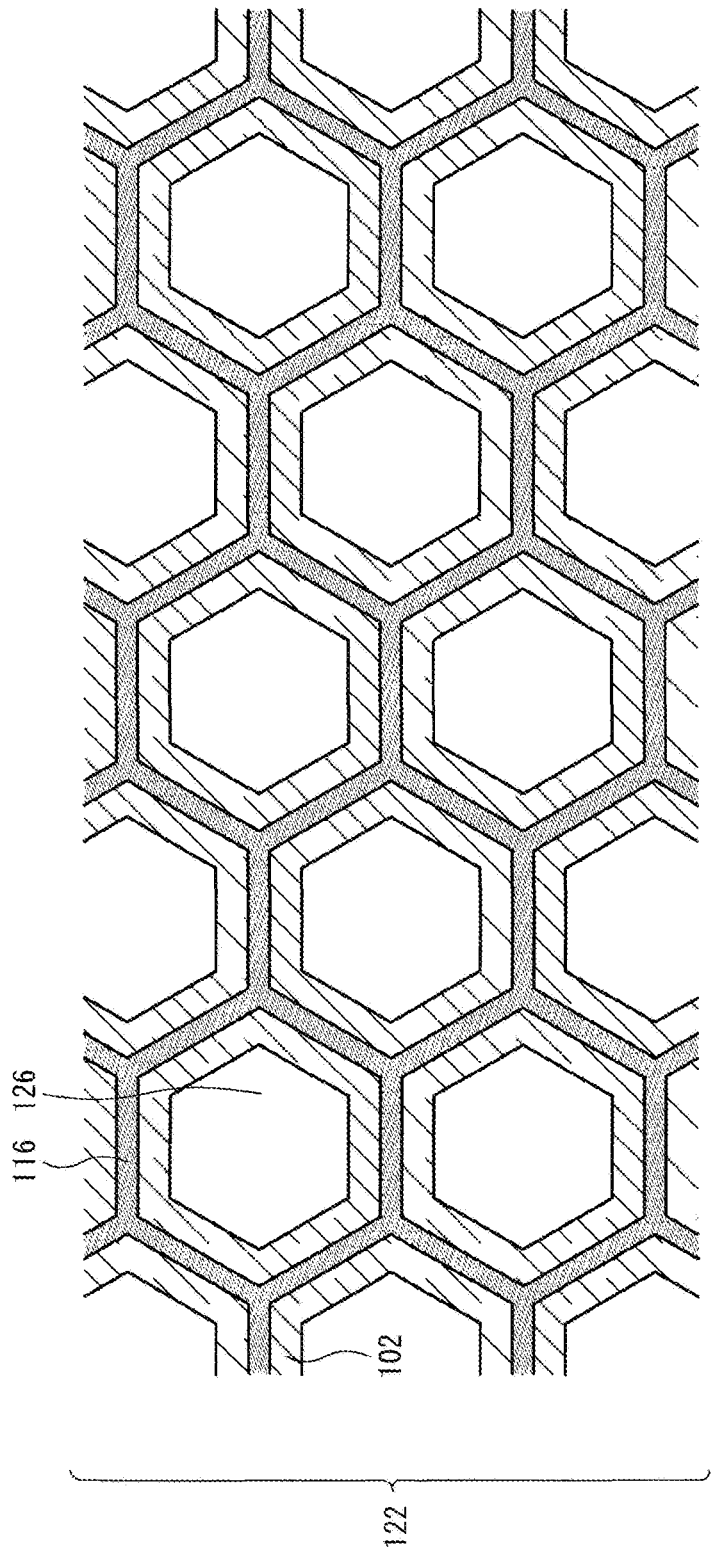
FIG. 11 is a plan view showing a structure of a wiring region of a display device according to an embodiment of the present invention.

As described above, the vertex of the first conductive pattern and the vertex of the adjacent second conductive pattern of the wiring 116 may be connected. As is shown in FIG. 11, the vertex of the first hexagonal conductive pattern and the vertex of the adjacent second hexagonal conductive pattern may be linearly connected. In FIG. 11, since the first wiring 116 and the second wiring 116 are bridged at the third wiring 116, the number of paths through which signals pass is greater than that of FIG. 10, thus disconnection of the wiring 116 may be further buffered.

Figure 12:
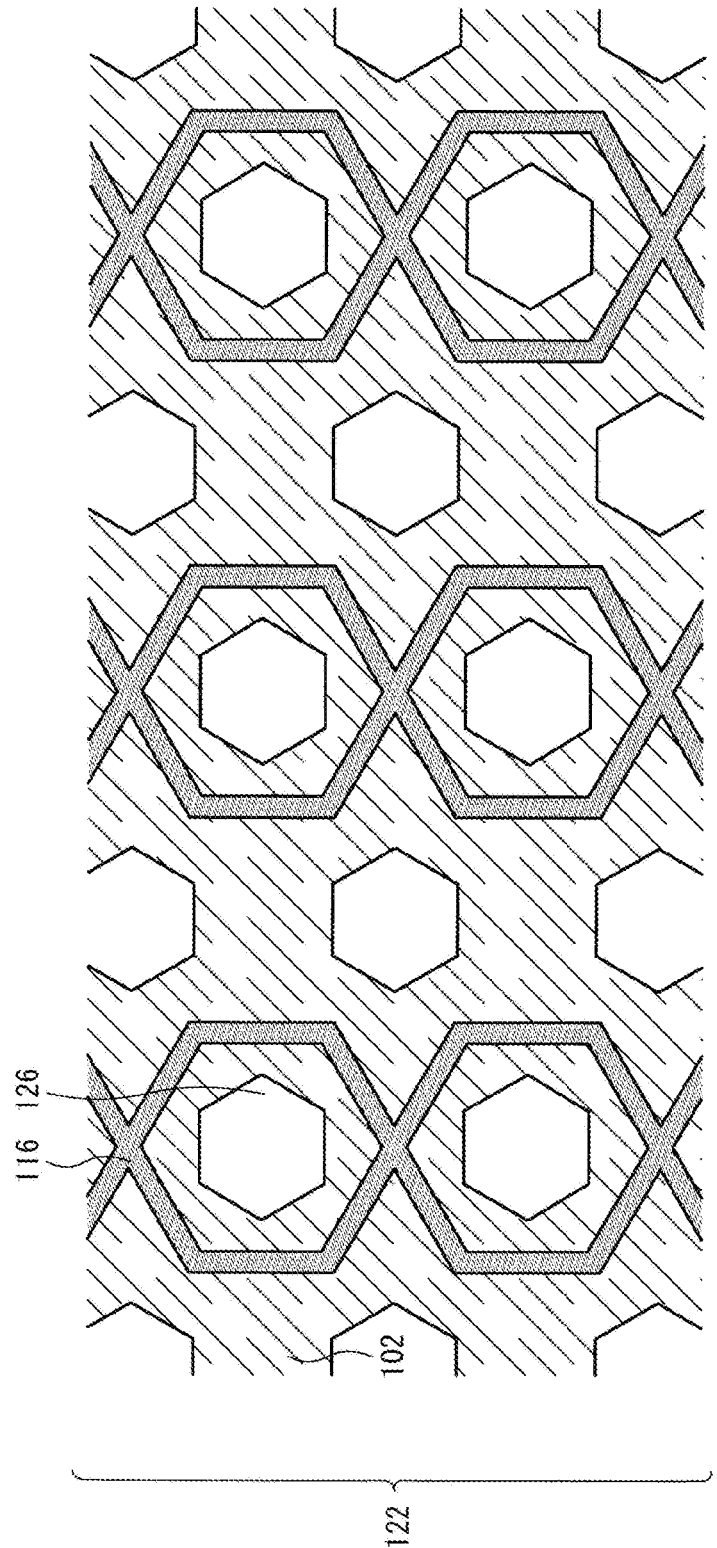
FIG. 12 is a plan view showing a structure of a wiring region of a display device according to an embodiment of the present invention.
Figure 13:
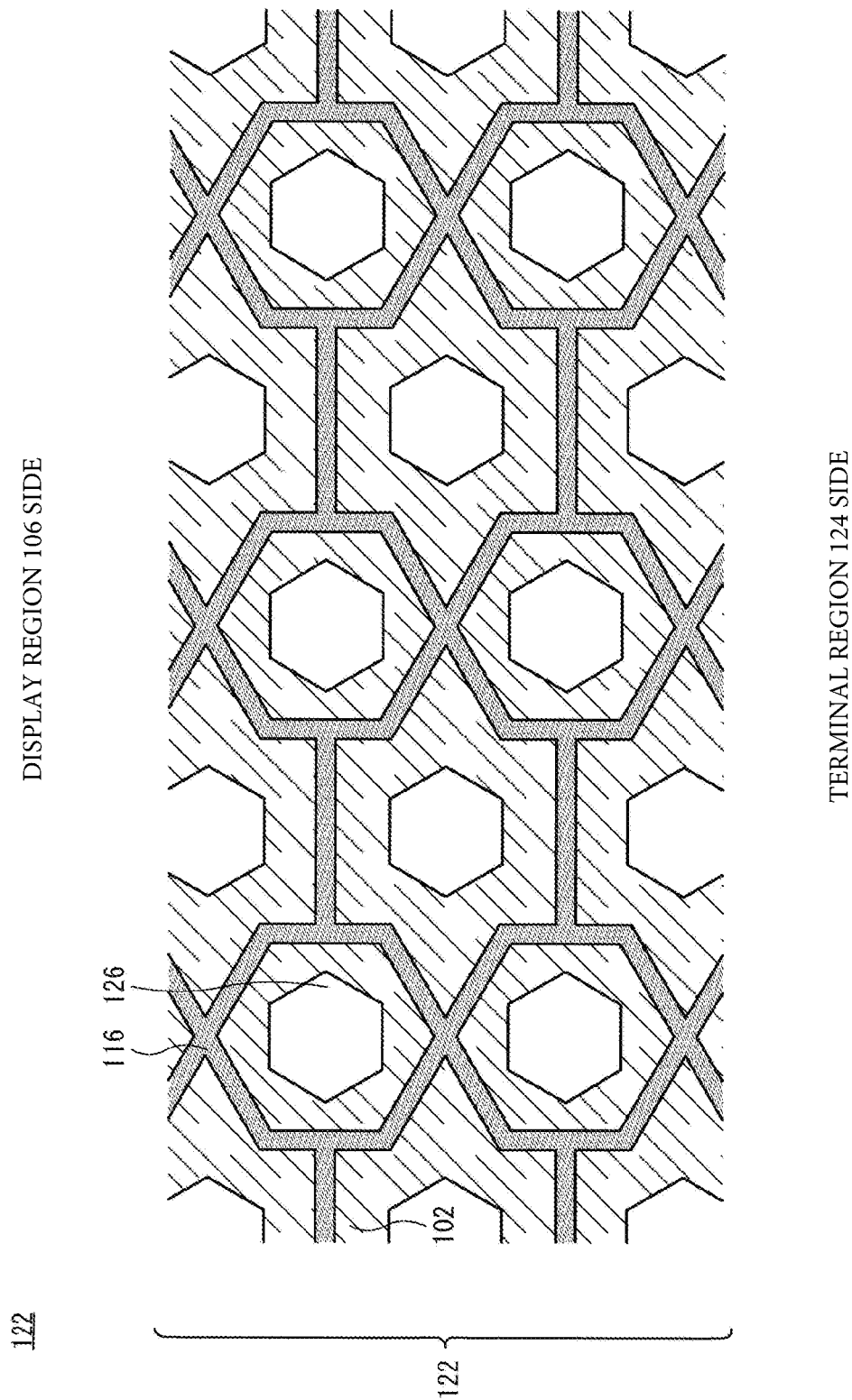
FIG. 13 is a plan view showing a structure of a wiring region of a display device according to an embodiment of the present invention.

The sides of the first conductive pattern and the second conductive pattern of the wiring 116 may be arranged so as to be adjacent. For example, as is shown in FIG. 12, the first hexagonal shaped conductive pattern and the second hexagonal shaped conductive pattern may be arranged so the sides of both are adjacent. Further, one side of the first conductive pattern and one side of the adjacent second conductive pattern of the wiring 116 may be connected. For example, as is shown in FIG. 13, the first hexagonal conductive pattern and one side of the second hexagonal conductive pattern may be linearly connected by a wiring.

Each of the embodiments described above as the embodiments of the present invention may be combined and implemented so long as they do not contradict each other. In addition, based on the display device of each embodiment, any appropriate addition, removal, or alteration of structural elements, or any addition, omission, or alteration of steps made by a person skilled in the art are included in the scope of the present invention, so long as they support the gist of the present invention.

In the present specification, an EL display device is mainly exemplified as an example of disclosure. So-called front panel type display devices such as other self-luminous type display devices, liquid crystal display devices, or electronic paper type display devices having electrophoretic elements may be given as other examples of application. Additionally, application is not particularly limited and may apply to small and middle sized to large sized devices.

Even if the function effects are different from the function effects from the implementation of each of the embodiments described above, it is understood that anything made clear from the contents of the present specification, or anything easily predicted by a person skilled in the art, naturally comes from the present invention.

What is claimed is:

1. A display device, comprising:
a base layer having a first surface and a second surface opposite to the first surface;
a display region arranged on the first surface of the base layer, a drive circuit region arranged outside of the display region, and a wiring region between the display region and the drive circuit region in a plan view, wherein
the wiring region includes a plurality of wirings having a plurality of conductive patterns,
at least one of the plurality of wirings has an inner portion in which none of the conductive patterns is provided;
the base layer includes a plurality of first through-holes,
a second through-holes the plurality of first through holes is arranged in the inner portion,
the wiring region has a first portion and a second portion adjacent to the first portion,
the plurality of conductive patterns includes a first conductive pattern in the first portion,
at least one of the plurality of first through holes is provided in the first portion and along with the first conductive pattern,
at least one of the plurality of conductive patterns was bent in the second portion,
a width of the first portion is bigger than the second portion,
two of the plurality of the first through-holes are located next to each other via the second portion and are surrounded by a conductive layer without interruption,
two of the plurality of second through-holes are located next to each other via the second portion and are located by, without completely surrounding, the conductive layer, and
a first short distance line between the two of the plurality of the first through-holes and a second short distance line between the two of the plurality of the second through-holes are crossed at the second portion.

2. The display device according to claim 1, wherein the plurality of first through-holes are extending from the first surface through the second surface.

3. The display device according to claim 1, wherein the plurality of conductive patterns includes a second conductive pattern,
the first portion includes the second conductive pattern separated from the first conductive pattern in the first portion,
the first conductive pattern has a first bent portion in the first portion,
the second conductive pattern has a second bent portion in the first portion,
the inner portion is surrounded by the first conductive pattern and the second conductive pattern,
a distance between the first conductive pattern and the second conductive pattern in the second portion is smaller than a distance between the first bent portion and the second bent portion.

4. The display device according to claim 3, wherein the first conductive pattern and the second conductive pattern were connected in the second portion.

5. The display device according to claim 1, wherein the plurality of wirings includes a first wiring and a second wiring extending along the first wiring, and
the second through hole is provided between the first wiring and the second wiring in the plan view.

6. The display device according to claim 4, wherein the plurality of wirings includes a first wiring and a second wiring extending along the first wiring, and
the second through hole is surrounded by the first wiring, the fourth wiring, and the third portion.

7. The display device according to claim 1, wherein the first through hole has a polygonal shape.

8. The display device according to claim 5, wherein the second through hole has a polygonal shape.

9. The display device according to claim 1, wherein the first through hole has a circular shape.

10. The display device according to claim 1, wherein the inner portion has a polygonal shape.

11. The display device according to claim 10, wherein the polygonal shape is a rhombus.

12. The display device according to claim 1, wherein the base layer is an organic resin layer.

13. The display device according to claim 1, wherein the display region and the drive circuit region include an inorganic insulating layer overlapping with the base layer and the plurality of wirings in a plan view.

14. The display device according to claim 1, wherein the base layer has a bent curved portion in the wiring region.

* * * * *